United States Patent [19]
Wang

[11] Patent Number: 6,166,571
[45] Date of Patent: Dec. 26, 2000

[54] HIGH SPEED FREQUENCY DIVIDER CIRCUIT

[75] Inventor: Hongmo Wang, Watchung, N.J.

[73] Assignee: Lucent Technologies Inc., Murray Hill, N.J.

[21] Appl. No.: 09/368,299

[22] Filed: Aug. 3, 1999

[51] Int. Cl.[7] .................................................. H03K 25/00
[52] U.S. Cl. ...................... 327/115; 327/117; 327/199; 327/201; 327/218
[58] Field of Search .............................. 377/47; 327/115, 327/117, 199, 200, 201, 202, 203, 208, 209, 210, 211, 212, 218

[56] References Cited

U.S. PATENT DOCUMENTS

| | | | |
|---|---|---|---|
| 3,656,010 | 4/1972 | Huyben et al. | 327/203 |
| 4,977,335 | 12/1990 | Ogawa | 327/204 |
| 5,359,241 | 10/1994 | Hasegawa et al. | 326/126 |

*Primary Examiner*—Tuan T. Lam
*Assistant Examiner*—Hiep Nguyen

[57] ABSTRACT

A high frequency divider circuit for producing output signals of half the frequency of an input clock signal includes two identical circuit sections, each producing an output signal and its complement. The circuit sections are connected to each other so that the output signals of one circuit section serve as input signals to the other circuit section. Each circuit section contains a load transistor which is controlled by one of the clock signal and the clock signal complement, and a switch transistor which is controlled by the other of the clock signal and the clock signal complement. The inventive circuit exhibits a reduced RC time constant for each circuit section and an increased output signal swing between the output signals and their respective complements, as contrasted with prior art frequency dividers, thereby increasing the overall circuit response time and its ability to operate at high frequencies.

4 Claims, 2 Drawing Sheets

HIGH SPEED FREQUENCY DIVIDER CIRCUIT

BACKGROUND OF THE INVENTION

1. Field of the Invention

The present invention relates to a frequency divider circuit, and more particularly to a frequency divider circuit capable of operating at high frequencies.

2. Description of the Related Art

Known frequency divider circuits operate in a master-slave flip-flop configuration of interconnected first and second sections which receive a clock signal having a frequency as an input and which output a signal having a frequency value substantially half of the clock frequency. The master-slave operation of such known circuits is achieved through feedback of the output signal of one circuit block as an additional input signal to the other circuit block and vice versa, i.e. as an input signal other than the clock signal.

A known frequency divider circuit 5 is shown in FIG. 1 and includes a first circuit section 10 and a second circuit section 20. (Connections between the two circuit portions 10 and 20 are omitted for ease of illustration.) Each circuit section has a pair of transistors that are connected to a DC voltage supply $V_{dd}$ and which receive a clock signal as an input at their gate terminals. For example, section 10 has transistors Q1 and Q2 that receive an input clock signal CLK of a frequency f, and section 20 has a pair of transistors Q3 and Q4 that receive as inputs at their gate terminals the complement of the clock signal CLK' having the frequency f. Circuit 5 generates output signals A, B and their logic complements A' and B' at frequencies substantially half the frequency of the clock signal, i.e. f/2, and the output signals are also used as input signals. In other words, the output signals are fed back to circuit sections 10 and 20 such that output signals B and B' generated by section 20 are received as inputs to section 10, and output signals A and A' are received as inputs to section 20. Each circuit section has two pairs of parallel input transistors, shown as transistor pairs Q5, Q5' and Q6 and Q6' for section 10, and Q7, Q7' and Q8, Q8' for section 20. Each transistor in each pair has a gate terminal that receives one of the generated output signals or its complement (A or A', B or B'). The circuit 5 operates as a sample and hold circuit wherein when, for example, section 10 samples, section 20 holds its then-present output signal state. In particular, when the clock signal CLK goes high, e.g., to a value equivalent to a logic "1", circuit section 10 performs a sampling function and circuit section 20 performs a hold function. When clock signal CLK goes low, e.g., to a value equivalent to a logic "0", CLK' goes high and circuit section 20 performs a sampling function while circuit section 10 performs a hold function wherein it maintains its prior output signal value.

The problem with circuit 5 is that the speed of operation is limited and, thus, the circuit outputs cannot adequately track or be generated in real time at high clock frequencies. For example, for 0.25 μm CMOS devices operating from a 2v Vdd supply, the maximum operating frequency is approximately 3 GHz. Two primary factors affect the operating speed of circuit 5. The first is the inherent RC time constant of each circuit section. The capacitance "C" in the RC time constant is the result of parasitic capacitance of the transistors in each circuit section, which is an inherent property of the transistors resulting from their manufacture and operating conditions. The resistance ("R") value is either the "on" or "off" impedance values of the transistors Q1, Q2, Q3 and Q4. Thus, when Q1 and Q2 are off, such as when signal CLK is high (Q1 and Q2 are shown by way of example as PMOS devices), which occurs precisely when circuit section 10 is in sampling mode, there is a high impedance which yields a high RC time constant and, consequently, a slow transition time and an increased delay in effecting a change in value of the output signals.

Another problem resulting in operating frequency limitations is the dependency of the change of state of each transistor pair (Q5 and Q5', Q6 and Q6', Q7 and Q7', Q8 and Q8') on the differential value of the input signals, i.e. the difference in values between signals A and A' for section 20 and the difference in signal values between signals B and B' for section 10. For the output signals (A, A', B, B') of each circuit section to change rapidly, a large differential signal is required so that, for example, when signal B is at a low value causing transistor Q6 to turn off, signal B' is at a high value causing transistor Q5 to turn on. However, as signals B and B' are both generated from section 20, and due to the circuit section configuration, these signals are close in value to each other.

For example, when circuit section 20 is in the hold mode, i.e. when signal CLK' is low, transistors Q3 and Q4 are on (for PMOS devices). Assuming signal B is low and signal B' is high, transistor Q7' will be on and transistor Q8' will be off. Thus, as for signal B', this signal is represented by the charge level on the parasitic capacitance at node Y', which is charged by voltage $V_{dd}$ through transistor Q4. The value of signal B, on the other hand, fluctuates somewhat because it is determined by the charge level on the parasitic capacitance at node Y, which continuously charges through transistor Q3 and continuously discharges through transistor Q7'. This causes the voltage differential between signals B and B' to be decreased, which inhibits the activation of transistors Q5 and Q6 at high speed, thereby delaying the changes of state of signals A and A'. The same result occurs with respect to circuit section 10 when CLK goes high.

SUMMARY OF THE INVENTION

The present invention provides a high frequency divider circuit for operatively producing output signals of half the frequency of an input clock signal. The divider circuit includes two identical circuit sections, each producing an output signal and its complement. The circuit sections are connected to each other so that the output signals of one circuit section serve as input signals to the other circuit section. Each circuit section contains a transistor, which is controlled by one of the clock signal or the clock signal complement, and a switch transistor which is controlled by the other of the clock signal or the clock signal complement so that, for the first circuit section, the transistor is controlled by the clock signal and the switch is controlled by the clock signal complement, and for the second circuit section the transistor is controlled by the clock signal complement and the switch is controlled by the clock signal. With this arrangement the inherent RC time constant for the circuit section primarily contributing to response delay is reduced because the inherent resistance of that circuit section is determined by the transistors' on-resistance. Moreover, the output signal swing between the output signals and their respective complements is also increased, thereby increasing the overall circuit response speed.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE CURRENTLY PREFERRED EMBODIMENT

Figure 1:
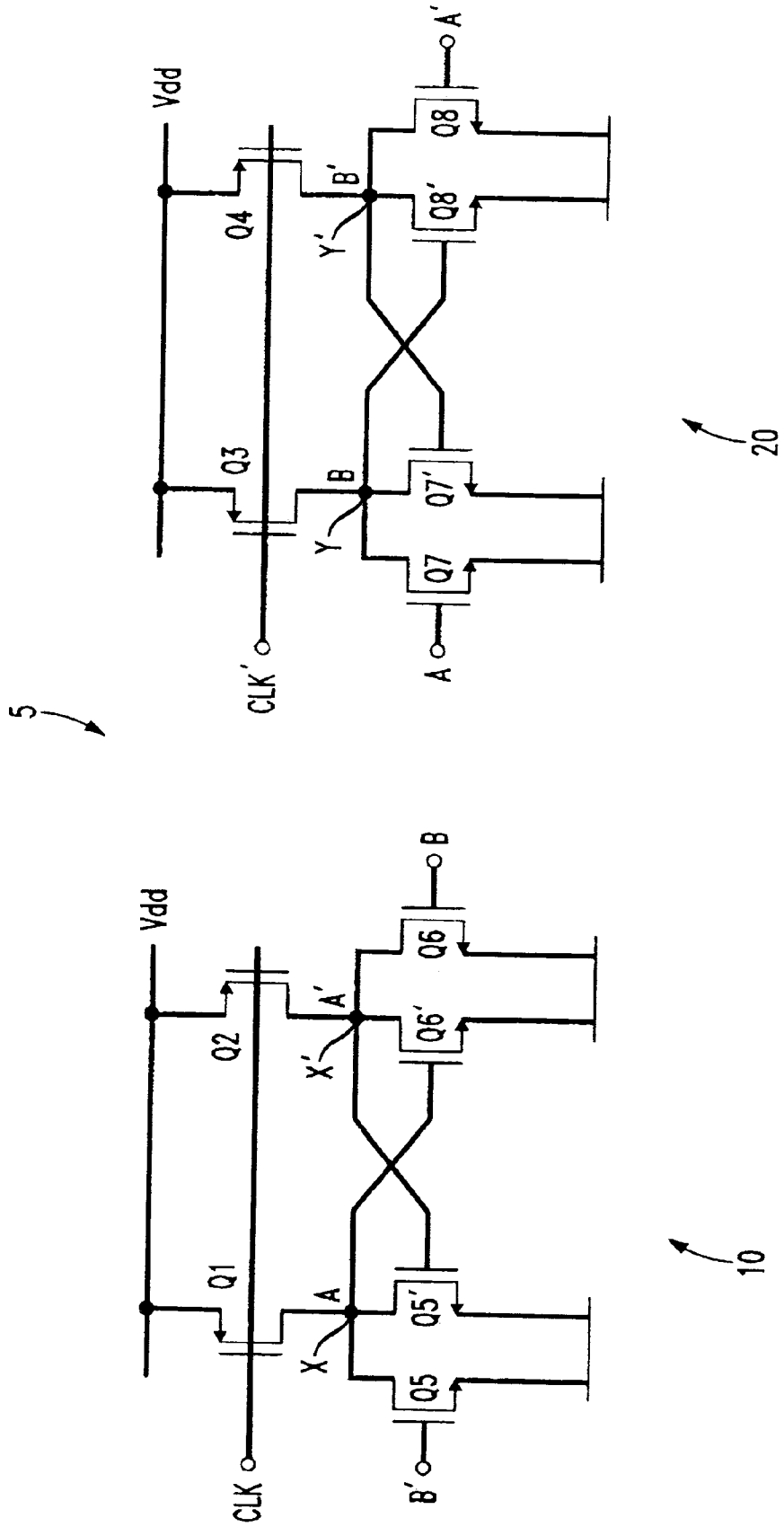
FIG. 1 is a schematic representation of a prior art frequency divider circuit.
Figure 2:
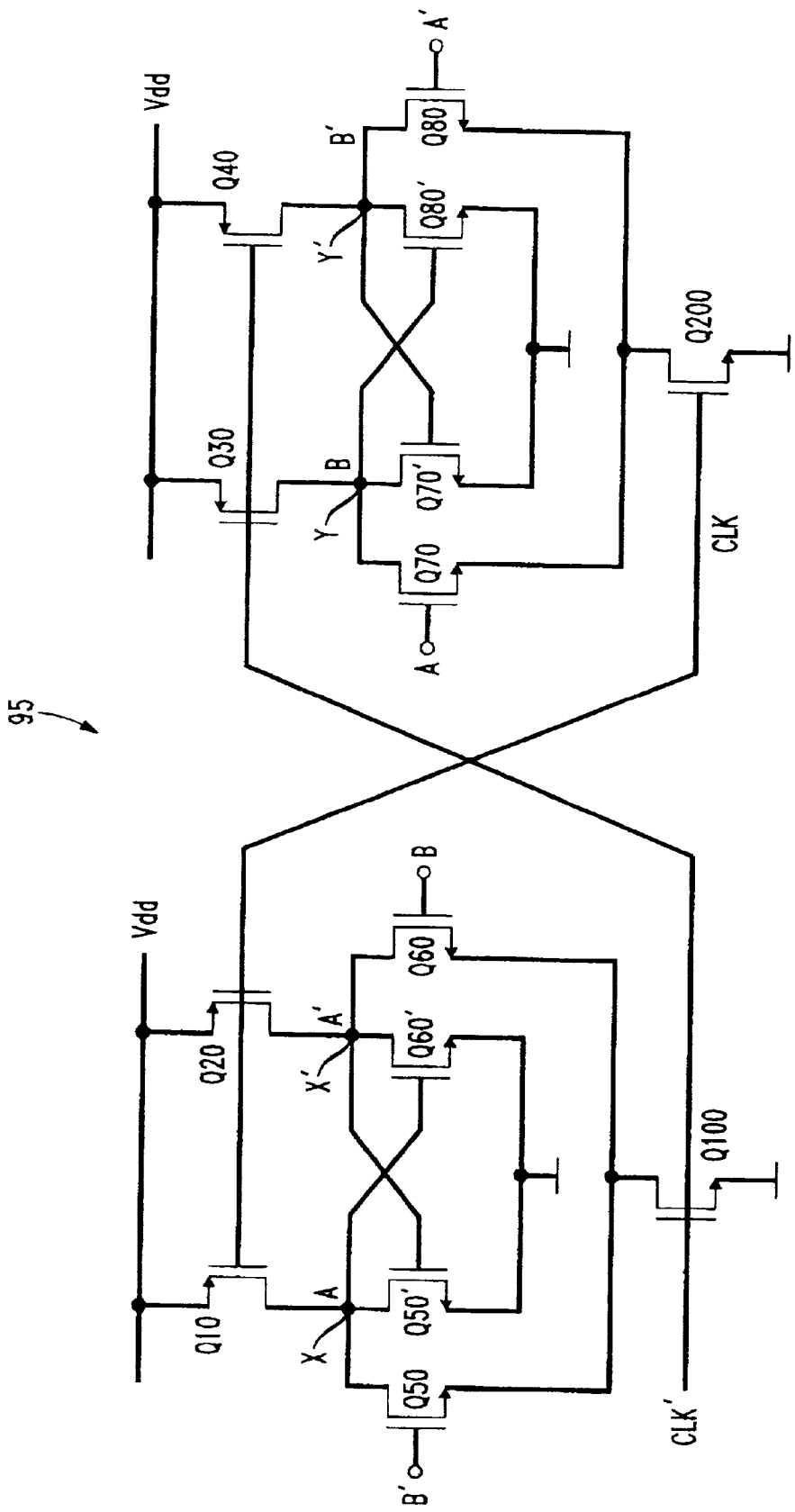
FIG. 2 is a schematic illustration of a high frequency divider circuit constructed in accordance with a preferred embodiment of the present invention.

A frequency divider circuit 95 in accordance with a preferred embodiment of the present invention is depicted in FIG. 2 and includes a first circuit section 100 and a second circuit section 200. The circuit sections, like the circuit sections 10 and 20 of the prior art arrangement of FIG. 1, are substantially identical to each other and function in a cooperative relationship wherein each section generates output signals for driving the other.

With specific reference to circuit section 100, this section receives four input signals, namely, a clock signal CLK having a frequency value, an input signal "B", a complement of the input signal B, shown as B' and a complement of the clock signal, CLK'. A pair of CMOS transistors Q10 and Q20, which are preferably P-channel transistors, are connected to a DC voltage source $V_{dd}$ and receive the clock signal as an input at their gate terminals. As is known in the art, when CLK is "high" or at a logic "1", transistors Q10 and Q20 will remain "off" or non-conducting, but will turn "on" and conduct when CLK goes "low".

Circuit section 100 includes two pairs of CMOS transistors, namely, a first pair including transistors Q50 and Q50', and a second pair including transistors Q60 and Q60'. Each CMOS transistor has, as is known in the art, source, drain and gate terminals. As shown, the drain terminals of the first transistor pair are connected at a node X that provides one of a first plurality of output signals, shown as signal "A". The drain terminals of the second pair of transistors are connected at a node X' that provides another of the first plurality of output signals, namely a complement of signal "A", shown as signal A'. The source terminals of transistors Q50' and Q60' are connected to a common ground and receive, at their gate terminals, the other of the output signal from the first plurality of outputs, such that the gate terminal of transistor Q60' receives signal A and the gate terminal of transistor Q50' receives signal A'. The source terminals of the other transistors in each pair, namely transistors Q50 and Q60, are connected to a transistor Q100 which functions as a switch and that receives and is controlled by the fourth input signal, namely a complement of the clock signal (CLK').

As stated above, the design of circuit section 200 is the same as that of circuit section 100, and is driven by first, second, third and fourth input signals. In particular, section 200 includes a pair of P-channel transistors Q30, Q40 connected to $V_{dd}$ and which receive, at their gate terminals, a complement of the clock signal CLK'. First and second pairs of transistors are provided which receive the second and third input signals, respectively. In particular, a first pair of transistors includes transistors Q70 and Q70' that are connected at their drain terminals to a node Y for providing one of a second plurality of output signals, namely signal B. Transistor Q70' is connected between transistor Q30 and common ground and receives the second input signal at its gate terminal. Transistor Q70 is connected between transistor Q30 and a second switch, namely a transistor Q200 driven by the fourth input signal, namely, clock signal CLK. As shown, the input signal "A" provided to transistor Q70 is one of the output signals generated from circuit section 100.

The second pair of transistors receives the remaining or third input signal which is the complement of signal "A", i.e. A', and which is another of the plurality of output signals produced by the first circuit section 100. The second transistor pair includes transistors Q80 and Q80' that are connected, at their drain terminals, to a node Y' at which the complement of signal "B", i.e. B', is provided. Transistor Q80' is connected between transistor Q40 and common ground and receives, at its gate terminal signal B, whereas transistor Q70' from the first pair of transistors receives at its gate terminal, signal B'. Transistor Q80 is connected between transistor Q40 and the second switch Q200 and receives at its gate terminal the complement of signal A, namely signal A'.

The primary differences between circuit 95 of FIG. 2 and the prior art circuit 5 of FIG. 1 is that a transistor in each pair of transistors in circuit 95 of the present invention is connected to a switch transistor namely, transistors Q100 and Q200, which are controlled by the clock complement and the clock, respectively. This seemingly simple modification changes the sample and hold operation of the circuit and creates several unexpected and beneficial results which allow the circuit 95 to operate at frequencies of 3 to 5 times the frequency capability of the prior art circuit 5 of FIG. 1. This highly advantageous and heretofore unavailable functionality is accomplished by successfully resolving the two primary constraints and drawbacks discussed above in connection with the operation of the circuit of FIG. 1, namely the presence of a large RC time constant during the sampling mode which causes delay in the change of state of the generated output signals, and the minimal voltage swing during the hold mode which is present between a signal and its complement, i.e. between the signals A and A' and between the signals B and B'. The successful resolution of these limitations will be apparent from the following explanation of the operation of circuit 95.

When the clock signal CLK is "low", i.e., at a logic "0", and CLK' is high, circuit section 100 functions in a sample mode and circuit section 200 functions in a hold mode. With regard to the RC time constant factor, when the clock signal is low, transistors Q10 and Q20 will turn on and conduct, thereby resulting in a low on-resistance and small impedance value for circuit section 100. This, as will be appreciated, lowers the RC time constant and allows the circuit sections 100 and 200 to operate at a higher frequency by virtue of reduced delay in the time required for the circuit output signals to change state.

As for the voltage swing and, for example, when circuit section 200—which generates signals B and B' used to cause circuit section 100 to change state—is in the holding mode, e.g., signal CLK' is high, transistors Q30 and Q40 are off. When signal CLK' is high, signal CLK is low and, therefore, transistor Q200 is also off. This causes transistors Q70 and Q80 to be off. As such, if signal B is low such that signal B' is high, transistor Q70' will turn on and transistor Q80' will turn off. As a result, the value of signal B' will not discharge, thus remaining at a high value. In contrast, as transistor Q70' is on, the value of signal B will discharge, thereby dropping to a lower value. In this manner, the voltage swing, i.e. B–B', is large which, in turn, provides a large voltage swing as the second and third input signals to circuit section 100.

The circuit design 95 of FIG. 2 in accordance with the present invention additionally exhibits certain inherent benefits. In particular, the parasitic capacitance associated with the transistors of the circuit sections contributes to further widening of the voltage swing between each signal and its complement. Thus, when transistor Q70' is on, the total charge carried by the parasitic capacitance at node Y will be drained to ground through transistor Q70', thereby further reducing the value of signal B. Moreover, the voltage at node Y' will increase as the swing of the clock complement CLK' goes high.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, although the circuit 95 is depicted with certain transistors as PMOS devices and other transistors as NMOS devices, it will be readily understood by those having ordinary skill in the art that the transistor types can be readily interchanged provided the proper operating voltages are present. It is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

I claim:

1. A frequency divider circuit for receiving an input clock signal having a frequency value and for producing signals having a frequency value substantially half of the frequency value of the input clock signal, comprising:

a first circuit section receiving a first input signal comprising said clock signal, a second input signal, a third input signal and a fourth input signal, and generating a first plurality of output signals, said first circuit section having a first switch and first and second pairs of transistors having gate terminals, one transistor from each said pair being connected to said first switch and receiving, at its gate terminal, one of said second and third input signals and outputting the first plurality of output signals, and the other transistor of each said pair being connected to a common ground and receiving, at its gate terminal, one signal of a second plurality of output signals, said first switch receiving the fourth input signal comprising a compliment of said clock signal as an input signal to said first switch; and a second circuit section receiving a fifth input signal comprising the complement of said clock signal, a sixth input signal, a seventh input signal and an eighth input signal, said sixth and seventh input signals defining said first plurality of output signals, and said second circuit section generating said second plurality of output signals comprising said second and third input signals, said second circuit section having a second switch and third and fourth pairs of transistors having gate terminals, one transistor from each of said third and fourth pairs being connected to said second switch and receiving, at its gate terminal, one signal of said first plurality of output signals, and the other transistor of each of said third and fourth pairs being connected to the common ground and receiving, at its gate terminal, one of said second and third input signals, said second switch receiving said eighth input signal comprising said clock signal as an input signal to said second switch.

2. The circuit of claim 1, wherein said transistors of said first, second, third and fourth transistor pairs comprise n-channel CMOS transistors.

3. The circuit of claim 1, wherein said first switch and said second switch comprise CMOS transistors.

4. The circuit of claim 3, wherein said CMOS transistors comprise n-channel transistors.

* * * * *